United States Patent [19]
Ito et al.

[11] Patent Number: 5,489,993
[45] Date of Patent: Feb. 6, 1996

[54] ORIGINAL IMAGE READING DEVICE

[75] Inventors: Hisao Ito; Hajime Sugino, both of Kanagawa, Japan

[73] Assignee: Fuji Xerox Co., Ltd., Tokyo, Japan

[21] Appl. No.: 223,137

[22] Filed: Apr. 5, 1994

Related U.S. Application Data

[63] Continuation of Ser. No. 940,845, Sep. 4, 1992, abandoned.

[30] Foreign Application Priority Data

Sep. 5, 1991 [JP] Japan ................................ 3-252779

[51] Int. Cl.⁶ .......................... H04N 1/04; H04N 1/46
[52] U.S. Cl. .................... 358/482; 358/474; 358/483; 358/513; 358/514
[58] Field of Search .................. 358/482, 471, 358/474, 483, 494, 408, 209, 213.11, 213.12, 213.28, 212, 241, 505, 513, 514; 348/207, 262, 272, 273, 275, 276, 277, 280

[56] References Cited

U.S. PATENT DOCUMENTS 4,663,535  5/1987  Nakai et al. ..................... 358/513
4,707,615  11/1987  Hosaka .......................... 358/514
4,763,189  8/1988  Komatsu et al. ................. 358/513

FOREIGN PATENT DOCUMENTS 63-9358   1/1988  Japan .
63-76567  4/1988  Japan .

*Primary Examiner*—Edward L. Coles, Sr.
*Assistant Examiner*—Thomas D. Lee
*Attorney, Agent, or Firm*—Finnegan, Henderson, Farabow, Garrett & Dunner

[57] ABSTRACT

An original image reading device having a plurality of light receiving elements for receiving light reflected from an original document, which are formed on a substrate, and for outputing image data signals. Two light receiving elements arrays are formed on a transparent substrate in association with two optical systems. The first light receiving elements array receives light coming through the upper surface of the transparent substrate. The second light receiving elements array receives light coming through the lower surface of the transparent substrate. With such a construction, the image at a location on an original document can be read with the two optical systems. Further, the construction can realize color original image reading device, high resolution, and different focal depths.

11 Claims, 8 Drawing Sheets

⟨SLA-6 TC=64⟩

ORIGINAL IMAGE READING DEVICE

This application is a continuation of application Ser. No. 07/940,845, filed Sep. 4, 1992, now abandoned.

BACKGROUND OF THE INVENTION

1. Field of the Invention

The present invention relates to an original image reading device for use in an image scanner, a facsimile machine and the like. More particularly, the invention relates to an original image reading device having a plurality of light receiving elements for receiving light reflected from an original document, which are formed on a substrate, and for outputing image data signals.

2. Description of the Related Art

With a conventional original image reading device, particularly a contact type image sensor, optical image data from the original is projected onto a light receiving element array without variation in size to be converted to electrical image data signal. In this case, the image projected is divided into a number of picture elements (corresponding to light receiving elements). Charges generated by the respective light receiving elements are temporarily stored every block in the capacitors existing among wires by using thin film transistor (TFT) switch elements, so as to read the stored charges in time-series manner out of the capacitors at a speed of several hundreds kHz to several hundreds MHz. The thus operated image sensor is known as a TFT drive type image sensor.

The TFT drive image sensor is operable for data reading with a single drive IC according to the operation of the TFT switch thereby resulting in reducing the number of drive ICs for driving the image sensor.

An example of an equivalent circuit of the TFT drive image sensor is as shown in FIG. 1, which is disclosed in Published Unexamined Japanese Patent Application No. Sho-63-9358 published in 1988. As shown, the TFT drive image sensor comprises a linear array 11 of light receiving elements, the length of which is approximately equal to the width of an original document, a charge transfer section 12 including thin film transistors $T_{i,j}$ (i=1 to N, and j=1 to n) connected to light receiving elements 11', respectively, and multi-layered wires 13 arrayed in a matrix fashion.

The linear array 11 is divided into N number of blocks each including n number of light receiving elements 11'. These light receiving elements 11' may be equivalently expressed in the form of photo diodes $P_{j,i}$ (j=1 to N, and j=1 to n). The light receiving elements 11' are connected to the drain electrodes of the thin film transistors $T_{i,j}$, respectively. The source electrodes of the thin film transistors $T_{i,j}$ are connected, every block, through the matrix arrayed multi-layered wires 13 to n number of common signal lines 14. The common signal lines 14 are further connected to a drive IC 15.

The gate electrodes of the thin film transistors $T_{i,j}$ are connected to a gate pulse generator 16 so that the transistors are simultaneously conductive every block. Photocharges generated in the light receiving elements 11' are stored, for a fixed period of time, in the parasitic capacitors of the light receiving elements and the gate-drain overlap capacitors of the thin film transistors $T_{i,j}$. Then, the photocharges, every block, are transferred to and stored in wire capacitors $C_i$ (i=1 to n) of the multi-layered wires 13. In this case, the thin film transistors $T_{i,j}$ operate as charge transfer switches.

In response to a gate pulse $\phi G1$ from the gate pulse generator 16, the thin film transistors $T_{l,l}$ to $T_{l,n}$ of the first block are turned on, so that the charges generated and stored by the light receiving elements 11' are transferred to and stored in the wire capacitors $C_i$. The charges stored in the wire capacitors Ci cause the potential of the common signal line 14 to vary. The varied potential is time sequentially output to the output line 17 by sequentially turning on the analog switches $SW_i$ (i=1 to n) within the drive IC 15.

Subsequently, in response to gate pulses $\phi G2$ to $\phi Gn$, the thin film transistors $T_{2,1}$ to $T_{2,n}$ to $T_{N,1}$ to $T_{N,n}$ of the second to Nth blocks are turned on. The charges generated and stored are transferred every block from the light receiving elements to the drive IC, and the charges are sequentially picked up. As a result, the image data signals of one scan line in the fast scan direction are collected. The above sequence of operations are repeated in the slow scan direction to thereby collect the image data signals of an image on the entire original document.

An overall construction of the original image reading device under discussion will be briefly described with reference to FIG. 2 which schematically illustrates the construction.

As shown in FIG. 2, the original image reading device includes a platen glass 21 on which an original document 20 is placed, a light source 22 for illuminating the original document 20 on the platen glass 21 with light emitted therefrom, a rod lens array 25 for condensing the reflected light from the original document 20 to form an erect image at 100% magnification on a light receiving element linear array 11, and the linear array 11 for converting the erect image of reflected light into electrical image data signals. The optical axis of the rod lens array 25 is perpendicular to the light receiving elements 11'.

With such a color contact type image sensor as disclosed in Published Unexamined Japanese Patent Application No. sho-63-76567 published in 1988, in which a color separation filter is attached to the light receiving part of light receiving elements, the same location on the original must be scanned plural times to collect color image data resulting in requiring much time to read the color image. More adversely, it is disadvantageous in that the processing for composing the image data that is read is complicated.

To increase the resolution, the conventional original image reading device employs the method to physically decrease the size of light receiving elements, thereby to increase a pixel (picture element) density of the light receiving elements array. However, there is a limit in decreasing the size of light receiving elements. This hinders the improvement of the resolution.

Additionally, since the focal depth of the rod lens array is small, problem arises when the original on the platen glass rise to the surface. As the result of the increased distance of the original from the rod lens array owing to the waving of the original to the surface , the rod lens array focuses the risen part of the image on the original at a location out of the focal depth. The risen part of the erect image is not focused on the linear array of light receiving elements, and visually become indistinct. Accordingly, high definition image data cannot be obtained.

SUMMARY OF THE INVENTION

The present invention has been made in view of the above circumstances and has an object to provide an original image reading device in which color image data is obtained by scanning the same location on the original one time, a high resolution is realized without physically decreasing the light receiving elements, and in-focus image data of light is selected from among the image data output from a plurality of rod lens arrays.

To solve the problems of the prior art, an image sensor comprising a substrate having a transparent region, a first sensor having a transparent electrode, a first photoconductive layer and a first electrode provided on the transparent region of said substrate, and a second sensor having a second electrode, a second photoconductive layer, and a second transparent electrode provided on the substrate.

Further an image sensor according to the present invention comprises a substrate having a transparent region, and a sensor having first transparent electrode, a first photoconductive layer, a light shielding electrode, a second photoconductive layer, and a second transparent electrode layered on the transparent region of the substrate.

BRIEF DESCRIPTION OF THE DRAWINGS

The accompanying drawings, which are incorporated in and constitute a part of the specification, illustrated presently preferred embodiments of the invention and, together with the general description given above and the detailed description of the preferred embodiments given below, serve to explain the principles of the invention in the accompanying drawings.

DESCRIPTION OF THE PREFERRED EMBODIMENTS

An embodiment of the present invention will be described with reference to the accompanying drawings.

Figure 1:
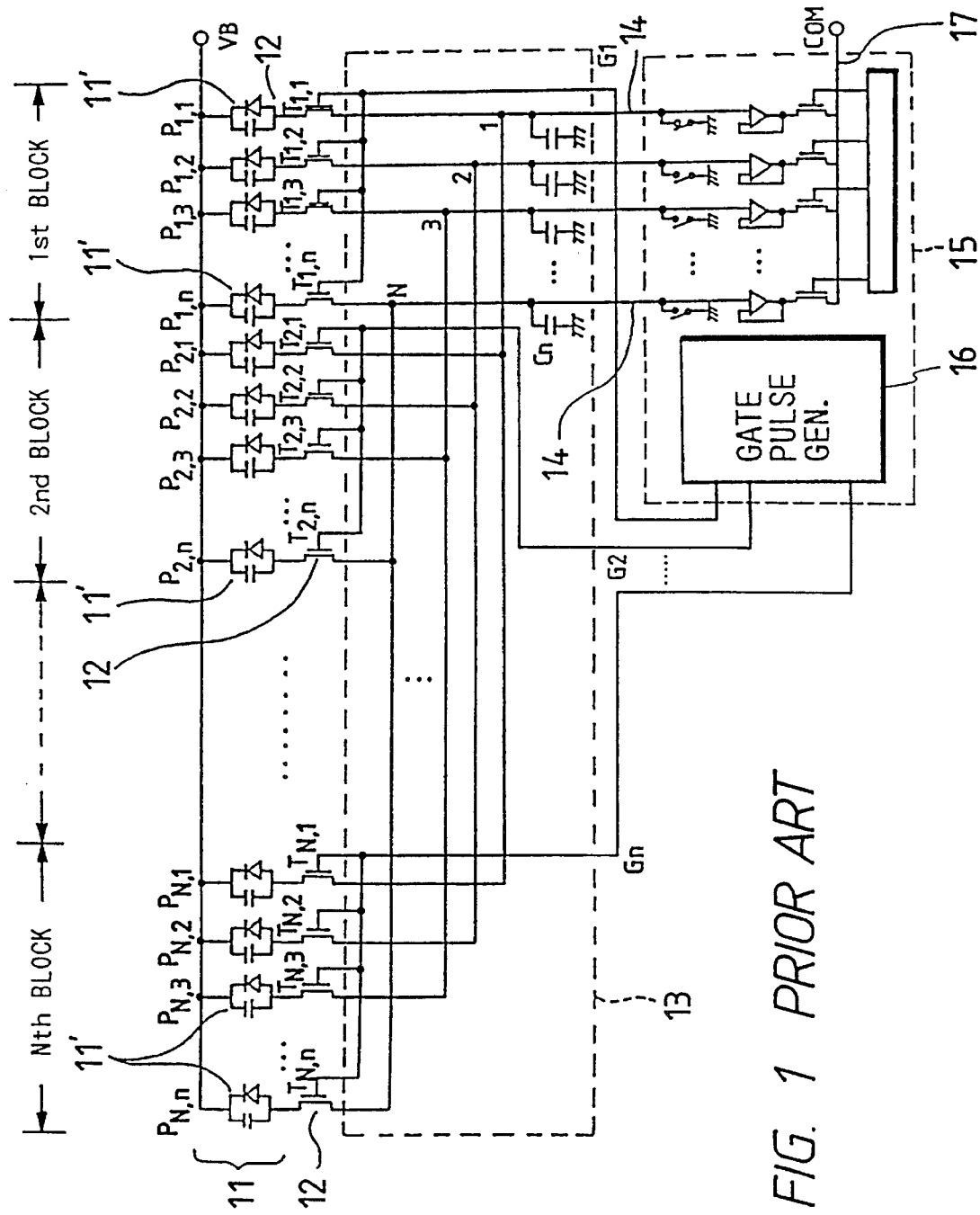
FIG. 1 is an equivalent circuit of a TFT drive image sensor in a conventional original image read device.
Figure 2:
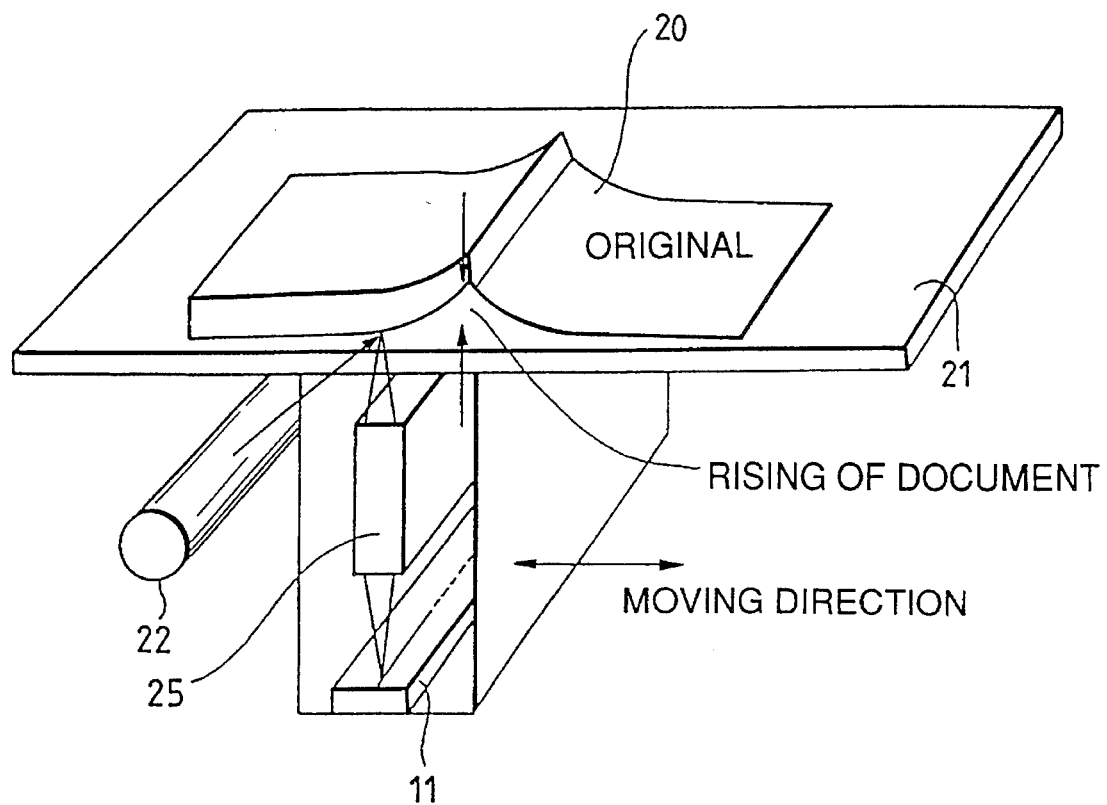
FIG. 2 is a view showing an overall construction of the original image read device.
Figure 3:
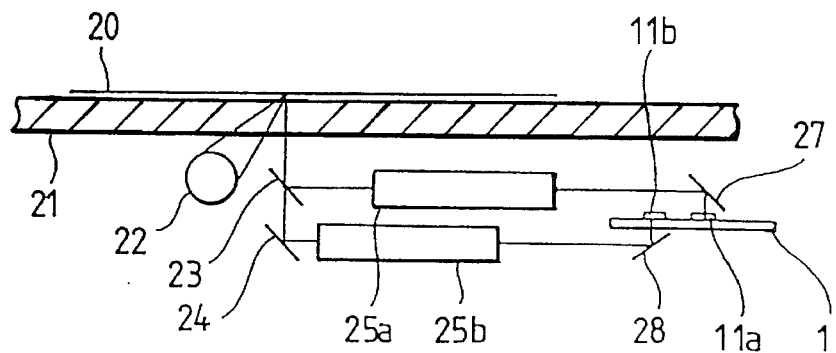
FIG. 3 is a view schematically showing the construction of an original image read device according to an embodiment of the present invention.

FIG. 3 is a view schematically showing the construction of an original image reading device according to the present invention. In FIG. 3, like reference numerals are used for designating like or equivalent portions in FIG. 2.

As shown in FIG. 3, the original image reading device of the present embodiment includes a platen glass 21 on which an original document 20 is placed, a light source 22 for projecting light toward the original 20 on the platen glass 21, two optical systems for condensing the reflected light from the original, and first and second arrays 11a and 11b of light receiving elements respectively associated with the two optical systems.

A first optical system includes a half mirror 23 which allows a part of the reflected light from the original 20 to pass therethrough and reflects the remaining part of the reflected light, a rod lens array 25a for condensing the reflected light from the half mirror 23 to form an erect image at 100% magnification, and a mirror 27 for reflecting the light of the erect image formed thereon by the rod lens array 25a.

A second optical system includes a half mirror 24 for reflecting the light transmitted through the half mirror 23 of the first optical system, a rod lens array 25b for condensing the reflected light from the half mirror 24 to form an erect image at 100% magnification, and a mirror 28 for reflecting light of the erect image formed thereon by the rod lens array 25b.

The first array 11a, provided in association with the first optical system, for receiving the reflected light from the mirror 27 is disposed vertical to incident light. The second array 11b, provided in association with the second optical system, for receiving the reflected light from the mirror 28 is disposed also vertical to incident light. Thus, image data are obtained through the first and second optical systems.

Figure 4:
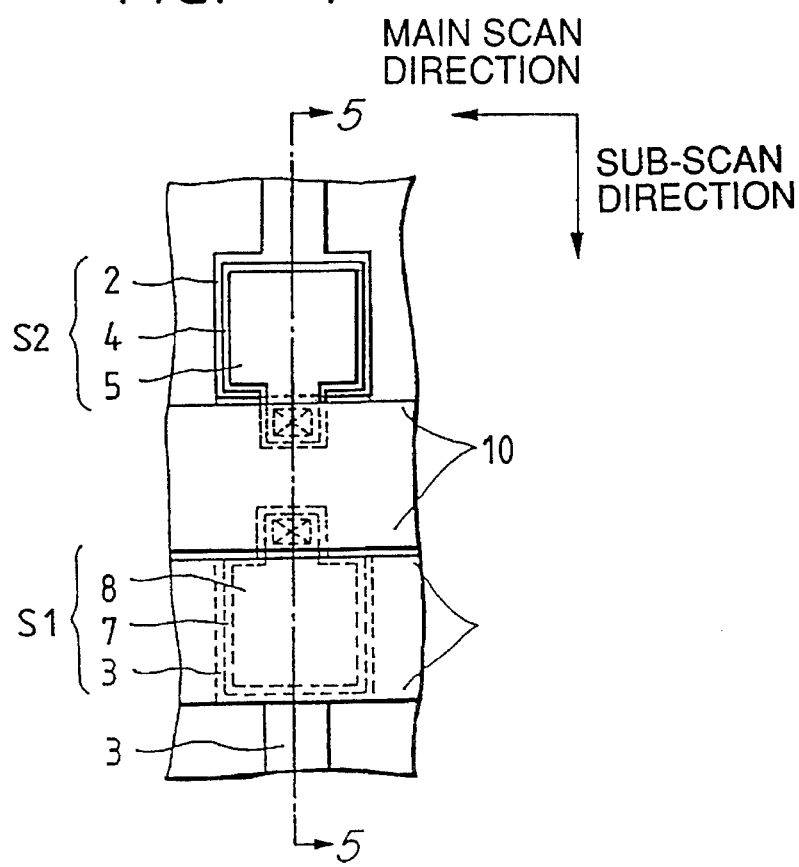
FIG. 4 is a plan view showing a part of an image sensor of the original image read device according to the first embodiment of the invention.
Figure 5:
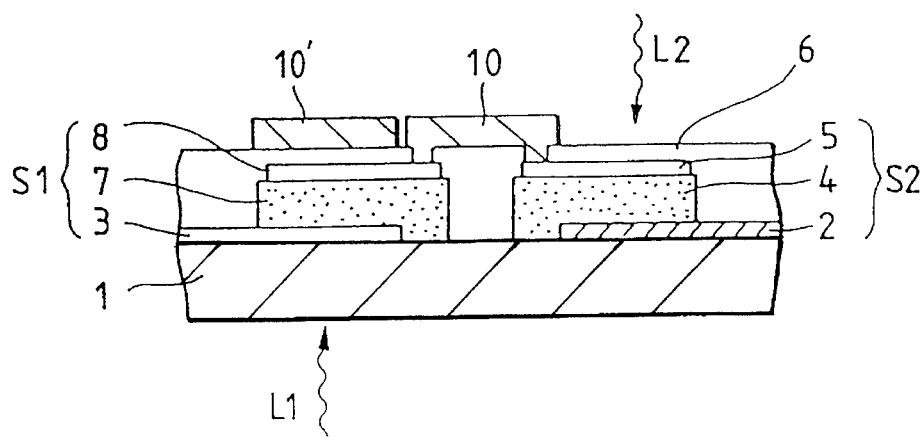
FIG. 5 is a cross sectional view showing taken on line A—A in FIG. 4.

An image sensor of the original image reading device according to the first embodiment of the invention will be described with reference to FIGS. 4 and 5. FIG. 4 is a plan view showing a part of an image sensor of the original image reading device according to the present embodiment of the invention. FIG. 5 is a cross sectional view showing taken on line 5—5 in FIG. 4. The embodiment to be described in connection with FIGS. 4 and 5 will be a first embodiment of the present invention.

As shown in FIG. 4, a couple of the light receiving elements S1 and S2, arrayed in the slow scan direction, are formed on an insulating transparent substrate 1, in order that two types of light receiving elements S1 and S2, which form an image sensor of the first embodiment receive the reflected light from the same location on an original document. A number of twin light receiving elements S1 and S2 are linearly arrayed in the fast scan direction, to form each of the first and second arrays 11a and 11b.

The structure of the twin light receiving elements S1 and S2 will be described with reference to FIG. 5.

The structure of the light receiving element S1 will first be described. The light receiving element S1 is formed of a first transparent electrode 3, which is made of indium tin oxide (ITO) and formed on the insulating transparent substrate 1, a semiconductor layer 7, which is made of p-i-n amorphous silicon (p-i-n a-Si : H) and formed on a first transparent electrode 3, a second transparent electrode 8 made of ITO formed on the semiconductor layer 7, an insulating layer 6 made of polyimide, for example, which covers the second transparent electrode 8, and a light shield layer 10' made of aluminum A1 (aluminum), for example, formed on the insulating layer 6.

The structure of the light receiving element S2 will now be described. The light receiving element S2 is formed of a first metal electrode 2 of Cr (chromium), for example, layered on the insulating transparent substrate 1, a semiconductor layer 4 of p-i-n a-Si: H layered on the first metal electrode 2, a transparent electrode 5 of ITO layered on the semiconductor layer 4, and an insulating layer 6 of polyimide, for example, covering the transparent electrode 5.

The second transparent electrode 8 of the light receiving element S1 and the transparent electrode 5 of the light receiving element S2 are both connected to the second metal electrode 10. The second metal electrode 10, shaped like a strip, extends in the fast scan direction, and functions to supply a bias voltage to the light receiving elements S1 and S2.

The first transparent electrode 3 and the first metal electrode 2 form the charge read sides of the light receiving elements S1 and S2. Light enters the light receiving element S1 from the lower surface of the insulating transparent substrate 1. The light shield layer 10' stops light entering the element S1 from the upper surface of the insulating transparent substrate 1. Light enters the light receiving element S2 from the upper surface of the insulating transparent substrate 1, and the first metal electrode 2 stops light entering the element S2 from the lower surface of the insulating transparent substrate 1.

The method of fabricating the light receiving elements S1 and S2 will be described with reference to FIGS. 4 and 5.

The insulating transparent substrate 1 is a glass substrate. Chromium is deposited on the insulating transparent substrate 1, approximately 500 to 1000 Å thick by a sputtering method. The formed chromium film is shaped into an intended pattern, which serves as the first metal electrode 2 of the light receiving element S2.

Subsequently, ITO is deposited on the substrate 1, approximately 500 to 1000 Å thick by a sputtering method. The formed ITO film is shaped into an intended pattern to serve as the first transparent electrode 3.

To form a p-i-n a-Si : H layer, a-Si : H of a p-type is first deposited on the structure, approximately 200 Å thick by a P-CVD method, using $SiH_4$ gas doped with $B_2H_2$ of 1%. Then, a-Si: H of an i-type is deposited, 1.5 μm thick by the same method, using $SiH_4$ gas. Finally, a-Si : H of a n-type is deposited on the structure, approximately 200 Å thick, using $SiH_4$ gas doped with $PH_3$ of 1%. As a result, the semiconductor layers 4 and 7 are formed.

ITO is deposited on the-structure, approximately 500 to 1000 Å by a sputtering method, and the formed ITO film is then shaped into an intended pattern as the transparent electrode 5. By using the same resist, the p-i-n a-Si: H layer is etched, and the projecting ITO layer like a visor is etched away, thereby to form the semiconductor layers 4 and 7. Then, the regist is peeled off.

Subsequently, the insulating layer 6 is formed in a manner that a polyimide film of approximately 1.5 μm thick is formed by a coating method, and is shaped into an intended pattern. The second metal electrode 10 and the light shield layer 10' are formed in a manner that aluminum is deposited, approximately 1 to 1.5 μm by a sputtering method and shaped into an intended pattern. In this way, the light receiving elements S1 and S2 of the first embodiment are fabricated.

The basic light receiving elements S1 and S2 are thus fabricated. A red and black image sensor may be formed by using the basic light receiving elements in a manner that a red color separation filter is applied on the light receiving part of the light receiving element S2 with a protecting layer layered therebetween, while the light receiving element S1 is as it stands.

The operation of the original image reading device of the first embodiment will be described with reference to FIGS. 3 through 5.

As shown in FIG. 3, the light source 22 projects light to the original 20 located on the platen glass 21. The half mirror 23 reflects part of the reflected light from the original 20 toward the rod lens array 25a, while it permits the remaining part of the reflected light to pass therethrough to the mirror 24.

The rod lens array 25a focuses the reflected light from the half mirror 23 to form an erect image on the mirror 27. The light of the erect image is reflected by the mirror 27, and enters the first array 11a from the upper surface of the insulating transparent substrate 1. At this time, each light receiving element S2 receives the reflected light.

The reflected light transmitted through the half mirror 23 is directed toward the rod lens array 25b by the mirror 24. The rod lens array 25b collects the reflected light to form an erect image on the mirror 28. Then, the erect image light enters the second array 11b from the lower surface of the insulating transparent substrate 1. This light is received by each light receiving element S1.

As shown in FIGS. 4 and 5, in the light receiving element S1, charge is read through the first transparent electrode 3. In the light receiving element S2, charge is read through the first metal electrode 2.

The reading operation of image data signals of one scanning line extended horizontally is repeatedly carried out to complete the reading operation till the reading operation for the last line. In this way, the image data of the entire image on the original document is read by the image sensor.

In the image sensor of the first embodiment, the second metal electrode 10, which interconnects the second transparent electrode 8 and the transparent electrode 5, is used as a common electrode for the light receiving elements S1 and S2. As a modification of the image sensor, the light receiving elements S1 and S2 are layered one above the other in a laminated manner, with the metal electrode as the common electrode.

Figure 6:
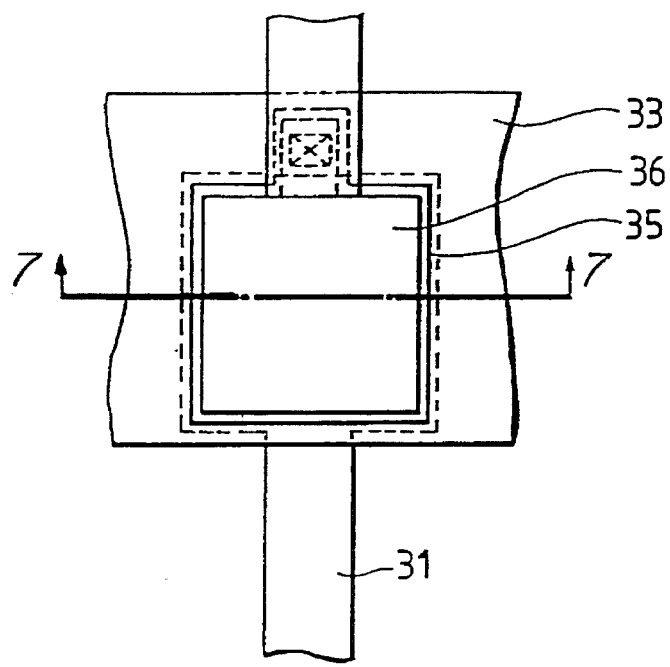
FIG. 6 is a plan view showing a part of a laminated image sensor.
Figure 7:
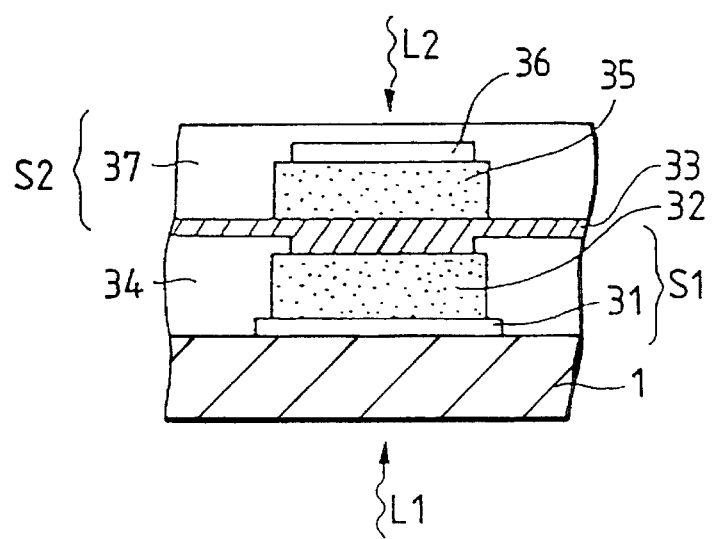
FIG. 7 is a cross sectional view taken on line 7—7 in FIG. 6.

The structure of the laminated image sensor as just mentioned will be described with reference to FIGS. 6 and 7. FIG. 6 is a plan view showing the laminated image sensor as the modification. FIG. 7 is a cross sectional view taken on line 7—7 in FIG. 6.

As shown in FIGS. 6 and 7, the light receiving element S1 is formed on the insulating transparent substrate 1, and the light receiving-element S2 is formed on the light receiving element S1. The light receiving element S1 receives light through the lower surface of the insulating transparent substrate 1. The light receiving element S2 receives light through the upper surface of the insulating transparent substrate 1.

The structure of the light receiving element S1 will be described. As shown, a first transparent electrode 31 is formed on the insulating transparent substrate 1, and a first semiconductor layer 32 is formed on the first transparent electrode 31. A first insulating layer 34 is layered on the thus formed structure, and the first insulating layer 34 on the first semiconductor layer 32 is removed. A metal electrode 33 is formed on the first semiconductor layer 32. The first transparent electrode 31 is extended in the slow scan direction. Charge generated in the light receiving element S1 is led out through the first transparent electrode 31.

In the structure of the light receiving element S2, a second semiconductor layer 35 and a second transparent electrode 36 are layered on the metal electrode 33 in this order. A second insulating layer 37 is further formed on the thus formed structure. A contact hole is formed in the second insulating layer 37. An aluminum wire is led out of the second transparent electrode 36 through the contact hole. The aluminum wire extends in the direction opposite to the extending direction of the lead wire of the first transparent electrode 31. The lead wire from the second transparent electrode is used for reading charges from the light receiving element S2.

In the light receiving element thus structured, the metal electrode 33, which extends in the fast scan direction, serves as a bias supply electrode for both the light receiving elements S1 and S2. Further, it also serves as a light shielding layer for the light receiving element S1. A number of the light receiving elements S1 and S2 pairs are arrayed in the fast scan direction, thereby to form a linear array of light receiving elements.

As recalled, the light receiving elements S1 and S2 respond to the light reflected from a location on the original to generate photocharge. As shown in FIGS. 4 and 5, the charge generated by the light receiving element S1 is read out through the first transparent electrode 31. The charge generated by the light receiving element S2 is read out through the second transparent electrode 36.

In the original image reading device of the first embodiment, and the original image reading device as its modification, the reflected light from a location on the original is split in two ways by the half mirror 23, and these split light beams are respectively received by the light receiving elements S1 and S2. Accordingly, in those devices, different color separation filters may be attached to the light receiving elements S1 and S2. The image sensor, if thus constructed, is capable of collecting color image data at a location on the original by one stroke of image reading operation.

In the original image reading device of the first embodiment, the light reflected at a location on the original is split into two optical systems. The light output from the two optical systems are respectively received by the two light receiving element arrays. If required, the reflected light may be split into at least three optical systems. In this case, three light receiving elements receive the light output from these optical systems, respectively.

Figure 8:
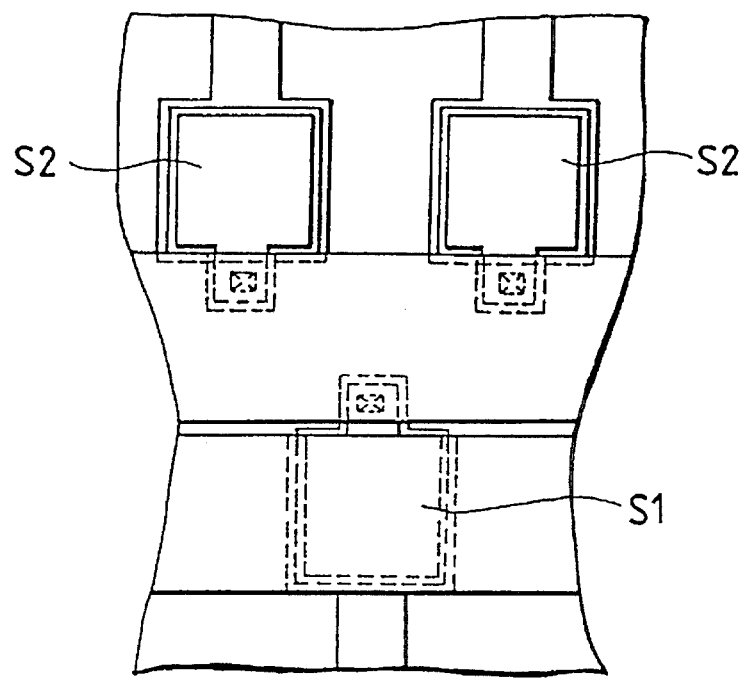
FIG. 8 is a plan view showing a part of an image sensor of an original image read device according to a second embodiment of the invention.

An image sensor of an original image reading device according to another embodiment of the present invention will be described with reference to FIG. 8 showing a plan view of a part of the image sensor. The embodiment described in connection with FIG. 8 will be called a second embodiment of the present invention.

In the image sensor of the second embodiment, the paired light receiving elements S1 and S2 are shifted by ½ pixel from each other in their arrangement, as shown in FIG. 8. In the arrangement of the paired light receiving elements S1 and S2, the element S1 faces the two adjacent elements S2 at the equal angles. Therefore, the data of an image on the original that is contained in the reflected light from the original can be read more definitely, providing a high resolution.

Figure 9:
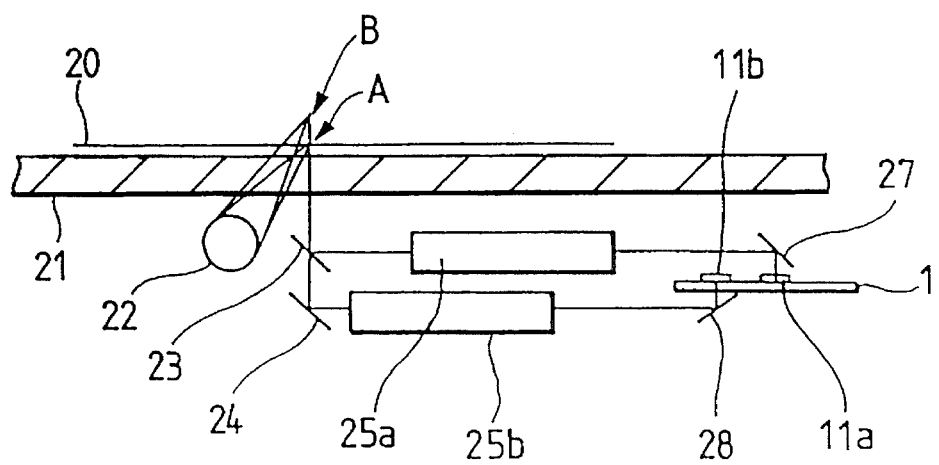
FIG. 9 is a view schematically showing the construction of an original image read device according to a third embodiment of the present invention.

An original image reading device according to yet another embodiment of the present invention will be described with reference to FIG. 9 schematically showing the construction of the image reading device. The embodiment described in connection with FIG. 9 will be called a third embodiment of the present invention. In FIG. 9, like reference numerals are used for designating like or equivalent portions in FIG. 3.

As shown, the original image reading device of the present embodiment includes a platen glass 21 on which an original document 20 is located, a light source 22 for projecting light toward the original 20 on the platen glass 21, two optical systems for condensing the reflected light from the original, and first and second arrays 11a and 11b of light receiving elements respectively associated with the two optical systems.

A first optical system includes a half mirror 23 which allow part of the reflected light from the original 20 to pass therethrough and reflects the remaining part of the reflected light, a rod lens array 25a of which the focal point is preset at a just-focus point A when the original 20 is located on the platen glass 21 in a close contact manner, and a mirror 27 for reflecting the light of the erect image formed thereon by the rod lens array 25a. A linear array 11 associated with the first optical system consists of a plurality of light receiving elements S2.

A second optical system includes a mirror 24 for reflecting the light transmitted through the half mirror 23 in the first optical system, a rod lens array 25b adjusted so as to have on the side closer to the original 20 the focal point B just (about 1 to 2 mm) above the platen glass 21, and a mirror 28 for reflecting the light of the erect image formed thereon by the rod lens array 25b. A linear array 11b associated with the second optical system consists of a plurality of light receiving elements S1.

A light receiving element S1 which is for converting the light from the second optical system into an electrical signal, and a light receiving element S2 which is for converting the light from the first optical system into an electrical signal, are arranged in the slow scan direction in a manner that they confront with each other. A number of pairs of the light receiving elements S1 and S2 thus arranged are linearly arrayed in the fast scan direction, thereby to form a linear array of light receiving elements. In this instance, two linear arrays 11a and 11b are formed on the insulating transparent substrate. These linear arrays are disposed so as to receive the incident light at right angle to the surface thereof.

Figure 10:
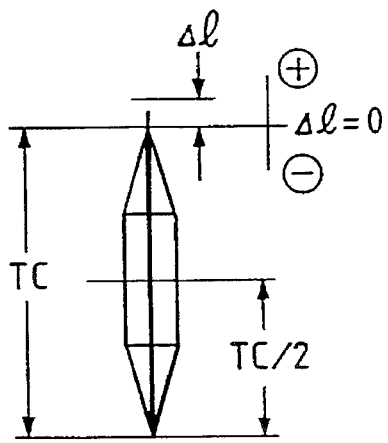
FIG. 10 is a view showing an image forming position at which an image is formed by a rod lens array used in the third embodiment.
Figure 11:
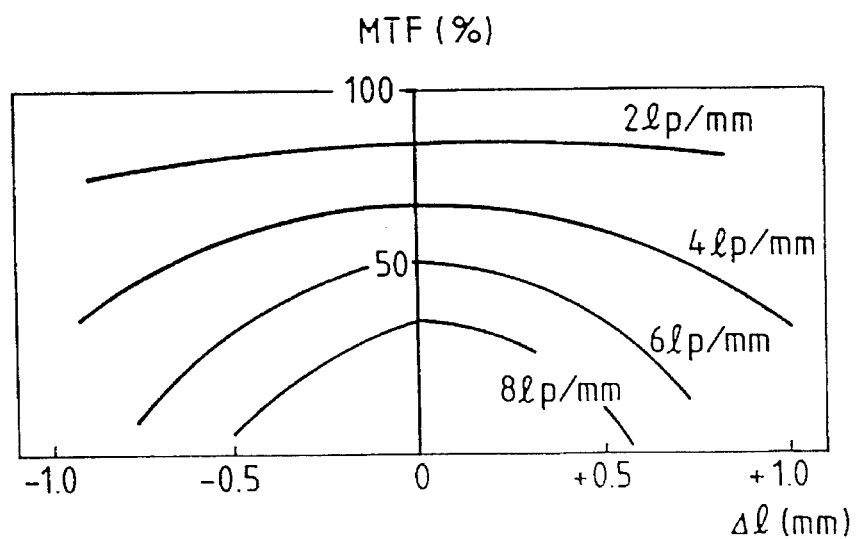
FIG. 11 is a graph showing the focal depth characteristic of the rod lens-array.

The focal depth characteristic of each of the rod lens arrays 25a and 25b in the third embodiment will be described with reference to FIGS. 10 and 11. FIG. 10 is a view showing an image forming position at which an image is formed by a rod lens array 25 used in the third embodiment. In the figure, $\Delta l=0$ indicates the just focus point of the rod lens array. A displacement from the just focus position is indicated by $\Delta l$. FIG. 11 is a graph showing the focal depth characteristic of the rod lens array, which describes the relationship between the $\Delta l$ and resolution (MTF). In the measurement of the focal depth characteristic, a SELFOC lens SLA-6 (TC 64), manufactured by NIHON ITA GLASS Co., Ltd., was used for the rod array lens 25. A green luminescent light was used for the light source 22.

As shown in FIG. 11, when a rod lens of 6 lp/mm (line per/mm; the number of rod lens arrays present within the distance of 1 mm), which represents a normal focal depth, is used, $\Delta l=0.8$ mm and MTF=10%. The displacement of 0.8 mm above the just focus point A is within the focal depth of the rod lens array 25b, since a curve representative of decrease of MTF is symmetrical with respect to $\Delta l=0$. In this case, it is seen that the point B of the focus position B of the rod lens array 25b is adjusted to a position displaced further upward from the just focus position 1.6 mm, larger than 0.8 mm.

The original image reading device can be improved to have the focal depth three times as high as that of the conventional one by selecting the image signal of the just-focus from among the image signals that are output from the light receiving elements S1 associated with the first and second optical systems.

Where another optical system is provided in addition to the first and second optical systems having preset focus positions, that is, three or more optical systems having the preset positions are used, and of the image signals output from those optical systems, the image signal having the highest focusing degree is selected, the focal depth attained is further deepened and hence the resultant image signal is more exact.

Figure 12:
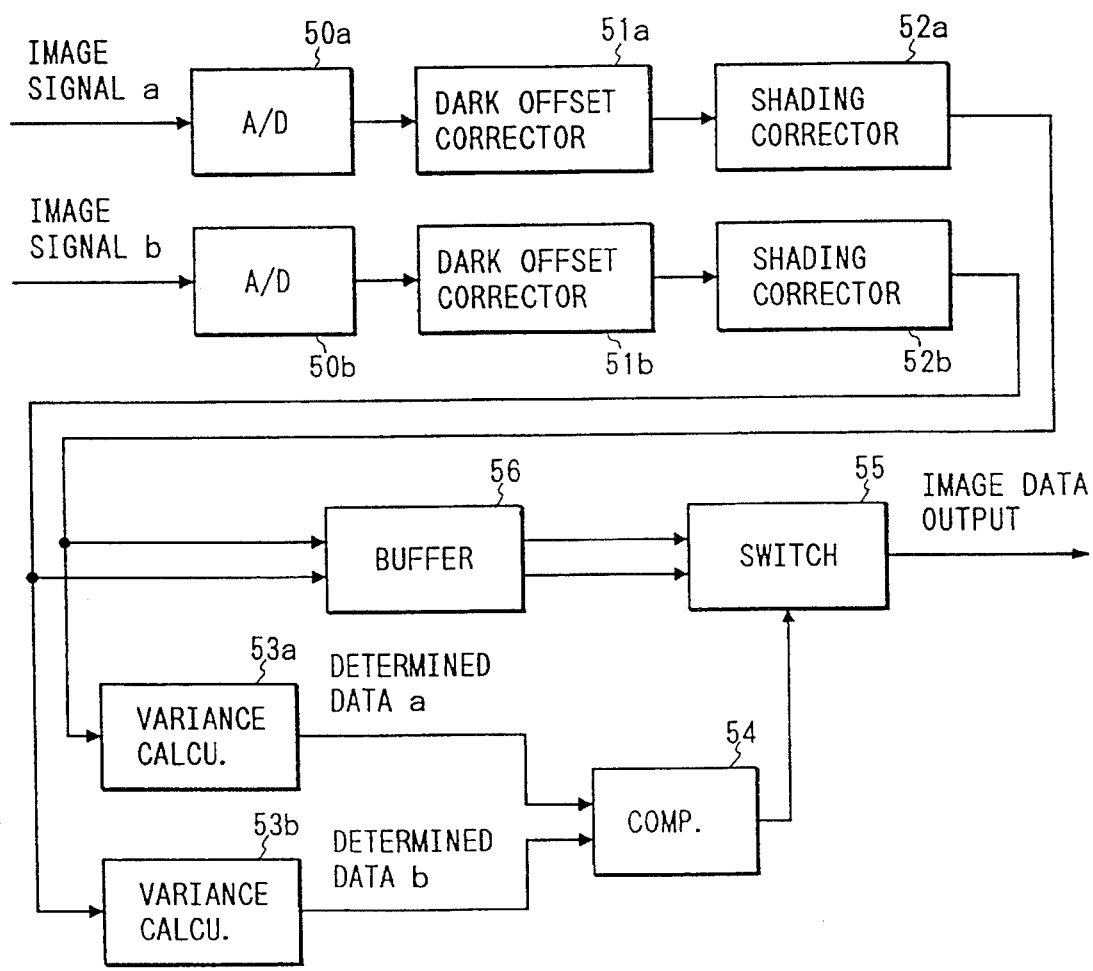
FIG. 12 is a block diagram showing an electrical arrangement to select the in-focus image signal from among the image signals output from a plurality of optical systems.

A method of selecting the image data signal having the highest focusing degree from among the image signals of a location on an image that are output from a plurality of optical systems, will be described with reference to FIG. 12. An original image reading device including two optical systems will be used for simplicity of explanation. FIG. 12 is a block diagram showing an electrical arrangement to select the in-focus image signal from among the image signals output from a plurality of optical systems.

The operation of the electrical arrangement for the image data selecting method will be described with reference to FIG. 12.

Image signals a and b output from the light receiving elements S2 associated with the first optical system and the light receiving elements S1 associated with the second optical system are digitized by A/D converters 50a and 50b. The image signals a and b digitized are applied to dark offset correctors 51a and 51b where these image signals are subjected to data offset correction processing. Further, the image signals are subjected to shading correction processing in shading correctors 52a and 52b. The thus obtained image data a and b are grouped into blocks, and stored in a buffer 56.

Variances Dv of the image data a and b, that are expressed by Formula 1, are calculated by variance calculators 53a and 53b. The calculated variances Dv1 and Dv2 are output in the form of determined data a and b. Calculation of the variances Dv1 and Dv2 are applied for the image data stored every block in the buffer 56.

$$D_v = \frac{1}{Nl^2} \left[ \sum_{n=1}^{Nl} x(n)^2 - \left\{ \sum_{n=1}^{Nl} x(n) \right\}^2 \right] \quad (1)$$

In the expression (1), when the number of light receiving elements constituting one block is Nl, and n indicates the order of light receiving elements arranged, x(n) indicates image data from the n-th light receiving element. The determined data a and b are compared by a comparator 54. A selector 55 responds to the larger determined data from the comparator, and selects the image data block corresponding to the larger determined data and allows that image data to output therefrom. The fact that the determined data is large indicates that a clear image is formed, and hence that the image is just focused.

Figure 13:
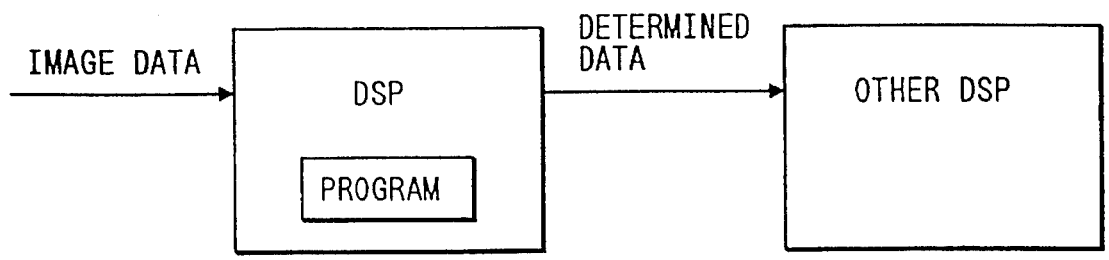
FIG. 13 is a functional block diagram showing an image signal selecting method based on an FFT (fast Fourier transform)
Figure 14:
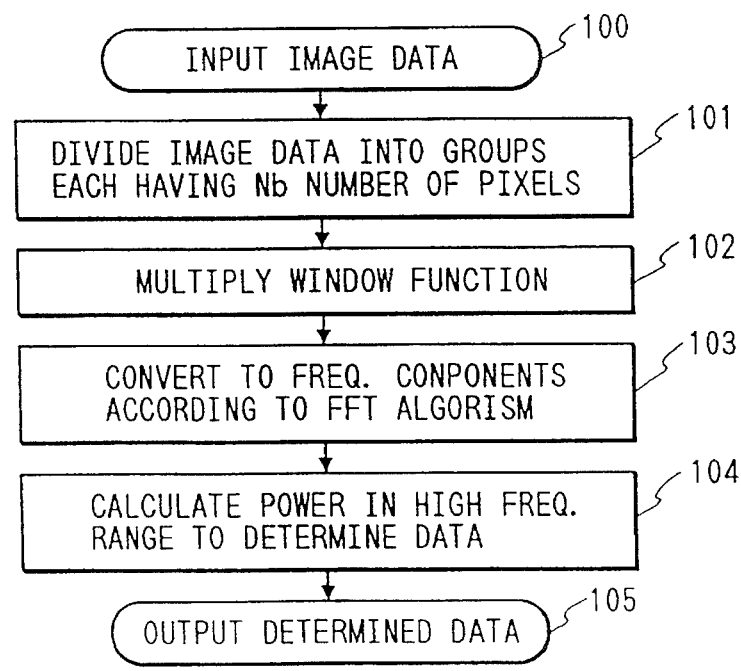
FIG. 14 is a flowchart showing a program flow of the image signal selecting method by FFT.

Another method of selecting the just focused image data, which uses a program of the fast Fourier transform (FFT), will be described with reference to FIGS. 13 and 14. FIG. 13 is a functional block diagram showing an image signal selecting method based on an FFT (fast Fourier transform). FIG. 14 is a flowchart showing a program flow of the image signal selecting method by FFT.

The FFT based image data-selecting method will be described with reference to FIG. 13.

In the selecting method, a plurality of light receiving elements of the first and second arrays 11a and 11b, which are for reading one-line image data on an original document, are grouped, within a range, into blocks. The image data is processed every block.

The series of image data of one block picked up is converted into spatial frequency components according to an FFT program contained in a DSP (digital signal processor). To pick up high frequency components, the powers of the spatial frequencies within a range between the spatial frequency of ½ pixel density of the arrays 11a and 11b and that of ¹⁄₁₆ pixel density are summed. The sum is used as determined data.

The fact that the determined data is large indicates that a less-blur or clear image is formed, and hence that the image is just focused. The comparison of the determined data is processed by another DSP. The image data of the block having the larger determined data is selected and output.

The image selecting method will be described in detail with reference to FIG. 14.

The image data read by the first and second arrays 11a and 11b for reading one-line image data is input to the DSP (100). The image data is grouped into blocks each consisting of Nb number of consecutive pixels (101). In order that the image data series-is converted into spatial frequencies later according to the algorithm of FFT, Nb is selected to be an exponent of 2. In this instance, Nb=512 or 1024. Image data x(n), which have been grouped into blocks each consisting of Nb number of pixels, is multiplied by a value of a window function w(n) given by Formula 2 (102). Here, n indicates the order of pixels within the block.

$$W(n) = 0.54 - 0.46 \cos\left(\frac{2\pi n}{Nb}\right) \quad (2)$$

To suppress increase of the high frequency components (to remove the noise component), the image data x(n) is multiplied by the value of window function w(n). A hamming window obtained by the expression (2) is used for the window function w(n), and as seen from the following expression (3) it is converted into an exponent of the base e of natural logarithm, which then is multiplied by x(n). The expression (3) is calculated according to the FET algorithm, thereby converting the image data into frequency components X(s) (103).

$$X(s) = \sum_{n=1}^{Nb} x(n) e^{-2\pi i \frac{ns}{Nb}} \quad (3)$$

Of the frequency components, those frequency components within a range between the frequency component ½ as large as the pixel density (s=Nb/2−1) and that ¹⁄₁₆ as large as the same (s=Nb/16−1) are summed by using the following expression (4), thereby forming determined data Ds (104). In the calculation of the expression (4), the frequency component X(s) and its complex conjugate X* are used. The thus obtained determined data Ds is subjected to a comparison processing that is carried out in another DSP. As the result of comparison, the largest determined data Ds is selected and output (105).

$$Ds = \sum_{s=\frac{Nb}{2}-1}^{\frac{Nb}{16}-1} X(s) X^*(s) \qquad (4)$$

In the original image reading device of the third embodiment incorporating the image selecting method as mentioned above, if the original 20 is curved slightly outwardly from the platen glass 21, the select processing including the variance calculation or the FFT-based frequency-component conversion guarantees to always provide the just focused image data signal.

According to the present invention, the reflected light from a location on an original is split into a plurality of optical systems. The light emanating from the plurality of optical systems are received by the light receiving elements provided in association with the plurality of optical systems. Such a construction allows the plurality of optical systems to read the image at the same location on the original, through one stroke of image reading operation. When the construction is applied for a color image sensor, the color image data processing is easy.

What is claimed is:

1. An image sensor comprising:

a substrate having a transparent region;

a first sensor having a transparent electrode, a first photoconductive layer and a first electrode provided on the transparent region of said substrate; and a second sensor having a second electrode, a second photoconductive layer, and a second transparent electrode provided on said substrate;

said first and second sensors receiving light beams reflected from the same position on an original through two different optical systems and from two opposing directions.

2. The image sensor according to claim 1 further comprising an insulator covering the surfaces of said first and second sensors, said insulator having a through-hole through which said first electrode and second transparent electrode are electrically connected.

3. The image sensor according to claim 2, further comprising light shielding means located at a position corresponding to said first electrode on said insulator.

4. The image sensor according to claim 1, wherein said received light beams are produced by optical path separation means including a half mirror and a mirror.

5. An original image reading device comprising a plurality of optical systems for splitting light reflected from a location on an original document and condensing the split light, and a plurality of light receiving elements being formed on a transparent substrate in association with the plurality of optical systems, and wherein some of the light receiving elements receive the reflected light from one direction, and the remaining light receiving elements receive the reflected light from a direction opposite the one direction.

6. The original image reading device according to claim 5 wherein a plurality of first light receiving elements and second light receiving elements are arrayed on said transparent substrate in a state that said first and second light receiving elements are shifted from each other in the arraying direction.

7. The original image reading device according to claim 5, wherein the plurality of optical systems includes optical path separation means including a half mirror and a mirror.

8. An original image reading device comprising:

a plurality of optical systems for splitting light reflected from a location on an original document and condensing the split light;

a plurality of light receiving elements for receiving the reflected light, the light receiving elements being formed on a transparent substrate in association with the plurality of optical systems;

a buffer for reading image signals of a plurality of pixels, the image signals produced every pixel by said light receiving elements provided in association with a plurality of optical systems and for storing the image signals of the plurality of pixels every block in the form of image data in the respective optical systems;

variance calculating means for calculating variances of the image data of said optical systems for each block stored in the buffer;

comparing means for comparing the calculated variances of the image data of said optical systems to provide the maximum value of the variances; and select means for selecting the image data corresponding to the maximum value output from said comparing means.

9. The original image reading device according to claim 8 wherein first light receiving elements for receiving light coming through the Upper surface of said transparent substrate and second light receiving elements for receiving light coming through the lower surface of said transparent substrate are commonly formed on said transparent substrate.

10. An original image reading device comprising:

a plurality of optical systems for splitting light reflected from a location on an original document and condensing the splitting light;

a plurality of light receiving elements for receiving the reflected light, the light receiving elements being formed on a transparent substrate in association with the plurality of optical systems;

calculating means for reading image signals of a plurality of pixels, which are produced every pixel by said light receiving elements provided in association with a plurality of optical systems, said calculating means receiving the image signals of the plurality of pixels in the form of image data in the respective optical systems to group the image data into blocks, and then to convert the blocks of image data to frequency components by a fast Fourier transform technique to calculate powers of the converted high frequency components;

comparing means for comparing the powers of the converted high frequency components of the blocks of image data for said respective optical systems that are output from said calculating means, to thereby provide the maximum value of the variances of the powers; and select means for selecting the image data corresponding to the maximum value output from said comparing means.

11. The original image reading device according to claim 10 wherein first light receiving elements for receiving light coming through the upper surface of said transparent substrate and second light receiving elements for receiving light coming through the lower surface of said transparent substrate are commonly formed on said transparent substrate.

\* \* \* \* \*

UNITED STATES PATENT AND TRADEMARK OFFICE
CERTIFICATE OF CORRECTION

PATENT NO. : 5,489,993
DATED : February 06, 1996
INVENTOR(S) : Hisao ITO et al

It is certified that error appears in the above-indentified patent and that said Letters Patent is hereby corrected as shown below:

Claim 9, Column 12, Line 28, "Upper" should read --upper--.

Claim 10, Column 12, Line 35, "splitting" should read --split--.

Signed and Sealed this

Twenty-fifth Day of February, 1997

Attest:

BRUCE LEHMAN

*Attesting Officer*  *Commissioner of Patents and Trademarks*